United States Patent
Schaller et al.

(10) Patent No.: US 12,030,450 B2
(45) Date of Patent: Jul. 9, 2024

(54) SENSOR DEVICES HAVING SENSOR AND MEMS MICROPHONE AND ASSOCIATED METHODS

(71) Applicant: Infineon Technologies AG, Neubiberg (DE)

(72) Inventors: Rainer Markus Schaller, Saal an der Donau (DE); Horst Theuss, Wenzenbach (DE)

(73) Assignee: Infineon Technologies AG, Neubiberg (DE)

( * ) Notice: Subject to any disclaimer, the term of this patent is extended or adjusted under 35 U.S.C. 154(b) by 104 days.

(21) Appl. No.: 17/351,329

(22) Filed: Jun. 18, 2021

(65) Prior Publication Data
US 2022/0009438 A1    Jan. 13, 2022

(30) Foreign Application Priority Data
Jul. 7, 2020 (DE) .......................... 102020117857.3

(51) Int. Cl.
*B60R 21/0136* (2006.01)
*B81B 3/00* (2006.01)
*B60R 21/013* (2006.01)

(52) U.S. Cl.
CPC ........ *B60R 21/0136* (2013.01); *B81B 3/0021* (2013.01); *B60R 2021/01302* (2013.01); *B81B 2201/0257* (2013.01)

(58) Field of Classification Search
CPC ................................................ B60R 21/0136
USPC ........................................................ 73/587
See application file for complete search history.

(56) References Cited

U.S. PATENT DOCUMENTS

| | | | |
|---|---|---|---|
| 7,468,933 B2 | 12/2008 | Sugiura et al. | |
| 7,711,467 B2 | 5/2010 | Nonaka et al. | |
| 8,326,581 B2 | 12/2012 | Schruellkamp | |
| 8,744,690 B2 | 6/2014 | Feser et al. | |
| 2006/0244245 A1* | 11/2006 | Nonaka | B60R 21/0136 180/274 |

(Continued)

FOREIGN PATENT DOCUMENTS

| | | |
|---|---|---|
| CN | 101054078 A | 10/2007 |
| CN | 101522476 A | 9/2009 |

(Continued)

OTHER PUBLICATIONS

Schillinger et al. Machine Translation of DE102004022808A1. Published Dec. 2005. Accessed Mar. 2023. (Year: 2005).*

(Continued)

*Primary Examiner* — Walter L Lindsay, Jr.
*Assistant Examiner* — Philip T Fadul
(74) *Attorney, Agent, or Firm* — Harrity & Harrity, LLP

(57) ABSTRACT

A sensor device includes a sensor which is configured to detect a physical quantity generated by an impact event and to generate first measurement data based on the impact event. The sensor device also includes a MEMS microphone configured to detect sound waves generated by the impact event and to generate second measurement data based on the impact event. The sensor device is configured to provide the first measurement data and the second measurement data to a logic unit. The logic unit is configured to detect the impact event based on a combination of the first measurement data and the second measurement data.

20 Claims, 6 Drawing Sheets

(56) References Cited

U.S. PATENT DOCUMENTS

| | | | |
|---|---|---|---|
| 2011/0004360 A1 | 1/2011 | Kolatschek | |
| 2014/0140518 A1* | 5/2014 | Trinh | B60R 21/013 381/56 |
| 2014/0195070 A1* | 7/2014 | Shimizu | B60W 30/095 701/1 |
| 2018/0070162 A1* | 3/2018 | Lim | H01L 23/043 |

FOREIGN PATENT DOCUMENTS

| | | | | |
|---|---|---|---|---|
| CN | 101821134 A | 9/2010 | | |
| CN | 102056774 A | 5/2011 | | |
| DE | 102004022808 A1 * | 12/2005 | | B60R 21/0132 |
| DE | 102004022808 A1 | 12/2005 | | |
| DE | 102006018901 A1 | 12/2006 | | |
| DE | 102006040651 A1 | 3/2008 | | |
| DE | 102007008387 A1 | 8/2008 | | |
| DE | 102014210426 A1 | 12/2015 | | |
| DE | 102016210773 A1 | 12/2017 | | |
| EP | 1764270 A1 | 3/2007 | | |
| WO | 9411223 A1 | 5/1994 | | |
| WO | WO-2020089410 A1 * | 5/2020 | | B60R 21/01 |

OTHER PUBLICATIONS

Wu Z., et al., "Practical Micro ECM Development Technology," Published by Southeast University Press, 2012, 11 pages.

* cited by examiner

SENSOR DEVICES HAVING SENSOR AND MEMS MICROPHONE AND ASSOCIATED METHODS

RELATED APPLICATION

This application claims priority to German Patent Application No. 102020117857.3, filed on Jul. 7, 2020, which is incorporated herein by reference in its entirety.

FIELD

The present disclosure relates to sensor devices having a sensor and a microelectromechanical system (MEMS) microphone, and to associated production methods. The present disclosure also relates to methods for detecting an impact event.

BACKGROUND

Sensor devices can be used, for example, in motor vehicles for promptly triggering the activation of air-bags. In such automotive air-bag applications, it can be necessary to distinguish reliably between an actual vehicle accident and a comparatively insignificant event, such as an impact of a ball against the vehicle. Manufacturers of sensor devices are constantly striving to improve their products. In particular, it may be desirable in this regard to develop sensor devices that provide a high level of reliability in the detection of impact events. It can also be desirable to provide associated detection methods and methods for producing such sensor devices.

SUMMARY

Various aspects relate to a sensor device. The sensor device includes a sensor which is configured to detect a physical quantity generated by an impact event, and to generate first measurement data based on the impact event. The sensor device also includes a microelectromechanical system (MEMS) microphone which is configured to detect sound waves generated by the impact event and to generate second measurement data based on the impact event. The sensor device is configured to provide the first measurement data and the second measurement data to a logic unit. The logic unit is configured to detect the impact event based on a combination of the first measurement data and the second measurement data.

Various aspects relate to a method for detecting an impact event. The method includes detecting a physical quantity generated by an impact event and generating first measurement data based on the impact event by means of a sensor. The method also includes detecting sound waves generated by the impact event and generating second measurement data based on the impact event by means of a MEMS microphone. The method also includes providing the first measurement data and the second measurement data to a logic unit, wherein the logic unit is configured to detect the impact event based on a combination of the first measurement data and the second measurement data.

Various aspects relate to a method for producing a sensor device. The method includes providing a sensor which is configured to detect a physical quantity generated by an impact event, and to generate first measurement data based on the impact event. The method also includes providing a MEMS microphone which is configured to detect sound waves generated by the impact event and to generate second measurement data based on the impact event. The method also includes encapsulating the sensor and the MEMS microphone in a housing, forming a sensor device. The sensor device is configured to provide the first measurement data and the second measurement data to a logic unit. The logic unit is configured to detect the impact event based on a combination of the first measurement data and the second measurement data.

BRIEF DESCRIPTION OF THE DRAWINGS

Devices and methods according to the disclosure are described in more detail in the following with the aid of drawings. The elements shown in the drawings are not necessarily reproduced true to scale relative to each other. Identical reference signs can refer to identical components.

DETAILED DESCRIPTION

The figures described below show devices and methods according to the disclosure. In these, the methods and devices described may be shown in a general form, in order to describe aspects of the disclosure in qualitative terms. The methods and devices described may have other aspects which for the sake of simplicity cannot be shown in the respective figure. However, each example may be extended by one or more aspects that are described in conjunction with other examples according to the disclosure. Thus, statements relating to a particular figure can apply equally to examples of other figures.

Figure 1A:
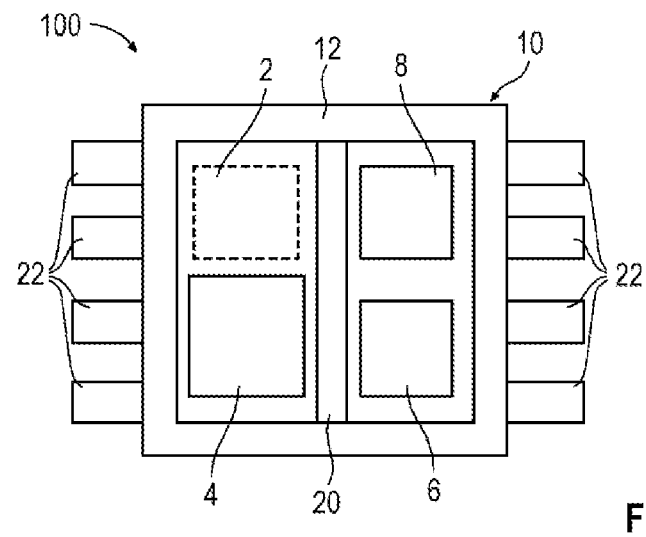
FIGS. 1A and 1B schematically illustrate a plan view and a cross-sectional side view, respectively, of a sensor device 100 according to one or more embodiments.
Figure 1B:
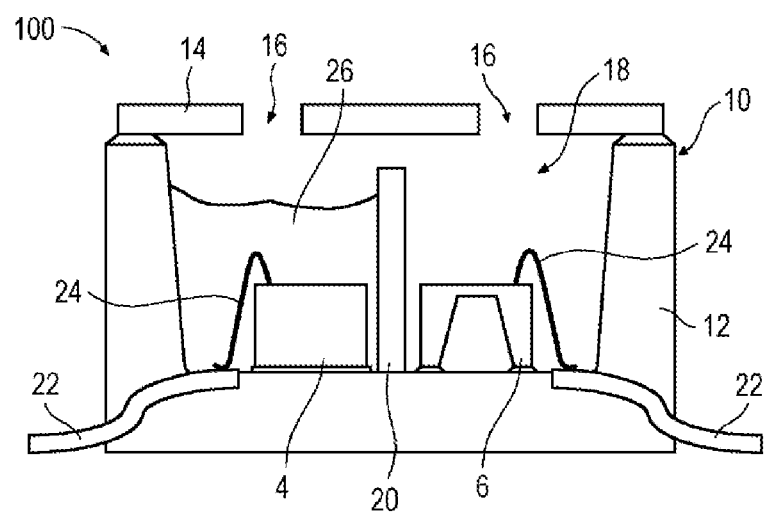

The sensor device 100 of FIGS. 1A and 1B can comprise an acceleration sensor 2, a pressure sensor 4, a microelectromechanical system (MEMS) microphone 6, and a logic unit 8. The components mentioned may be arranged in a common housing 10, which can comprise a shell 12 and a lid 14 with one or more sound openings 16. For example, the shell 12 and/or the lid 14 can be made of a molding compound. Molding compounds mentioned in this description can comprise at least one of an epoxy, a filled epoxy, a glass fiber-filled epoxy, an imide, a thermoplastic, a thermosetting polymer, or a polymer mixture. The molding compounds may be produced using one or more of the following techniques: compression molding, injection molding, powder molding, injection molding (liquid molding), etc.

The shell 12 and the lid 14 can form a cavity 18, which can be divided into two subspaces by a partition 20. This allows the sensors 2, 4 to be selectively embedded in a protective material 26 (e.g. a gel, glob-top, etc.), which can prevent, for example, corrosion of contact pads of the sensors 2, 4. The sound openings 16 can provide one or more gas connections between the cavity 18 and the area surrounding the sensor device 100, so that pressure changes, sound waves, etc. can be detected by sensitive sensing structures of the sensors 2, 4 and of the MEMS microphone 6.

Electrical terminal conductors 22 can pass through the shell 12, which allow the sensor device 100 to be electrically connected to a printed circuit board (not shown), for example. The components arranged in the housing 10 can be electrically connected to the electrical terminal conductors 22 via electrical connection elements 24. For example, the electrical connection elements 24 can comprise one or more of bond wires, clips, or tapes. An electrical connection between a printed circuit board and the electronic components in the housing 10 can thus be provided via the electrical terminal conductors 22 and the electrical connection elements 24.

In the example of FIGS. 1A and 1B, the sensor device 100 can comprise both an acceleration sensor 2 and a pressure sensor 4. In other examples, sensor devices according to the disclosure can comprise only one of the two types of sensors mentioned. The acceleration sensor 2 can be configured to detect accelerations generated by an impact event. In an example, the acceleration sensor can be a capacitive acceleration sensor. Based on the accelerations detected by the acceleration sensor 2, measurement data can be generated which can be provided to other components of the sensor device 100, in particular the logic unit 8. The measurement data can be either raw data or processed data. Examples of accelerations detected by an acceleration sensor for different impact events are shown and described in FIG. 6.

The pressure sensor 4 can be configured to detect pressures generated by an impact event. For example, the pressure sensor can be a capacitive pressure sensor. Based on the pressures detected by the pressure sensor 4, measurement data can be generated and provided to other components of the sensor device 100, in particular the logic unit 8. The measurement data can be either raw data or processed data. Examples of pressures detected by a pressure sensor for different impact events are shown and described in FIG. 7.

The MEMS microphone 6 can be configured to detect sound waves generated by an impact event and to generate measurement data based on the impact event. The measurement data can be provided to other components of the sensor device 100, in particular the logic unit 8. The measurement data can be either raw data or processed data. For example, raw data generated can be further processed by means of a Fourier transform. Examples of measurement data for an impact event, recorded by a MEMS microphone and Fourier-transformed, are shown and described in FIG. 8.

The MEMS microphone 6 can be configured to detect sound waves up to a frequency of approximately 20 kHz, more precisely up to approximately 10 kHz, more precisely up to approximately 5 kHz, and even more precisely up to approximately 3.5 kHz. Accordingly, the measurement data provided by the MEMS microphone 6 can be based on the specified frequency ranges. The measurement data provided by the MEMS microphone 6 can therefore be, in particular, audio data, such as can be provided by an audio MEMS microphone. Examples of measurement data recorded by the MEMS microphone 6 are shown and described in FIG. 8. Alternatively, or in addition, the MEMS microphone 6 can be configured to detect ultrasonic waves, so that the measurement data provided by the MEMS microphone 6 can also be based on an ultrasonic frequency range.

Measurement data of the sensors 2, 4 and the MEMS microphone 6 based on an impact event can be made available to the logic unit 8. The logic unit 8 can be configured to detect the impact event based on a combination of these measurement data provided to it. The logic unit 8 can be configured in particular to detect a wide range of different impact events. In one example, an impact event can be an accident (such as a head-on crash or side-on crash) of the vehicle, that is, a collision of the vehicle with another vehicle or a comparatively large object. Such an event may be considered a "real" or "relevant" impact event, since the safety of the persons in the vehicle may be endangered. In other examples, an impact event may be a "minor" or "insignificant" event, in which personal safety is not necessarily put at risk. For example, such an impact event may be a vehicle door being slammed, an impact of an object (e.g. a ball) on the vehicle, a window being broken, vandalism, etc. The measurement data of each of the impact events mentioned may have specific properties and characteristics that can be analyzed and evaluated by the logic unit 8.

The logic unit 8 can be configured to supply a signal to activate an air-bag if the unit identifies an impact event as a vehicle accident. According to the disclosure, to detect the impact event the logic unit 8 can take both measurement data of the acceleration sensor 2 and/or the pressure sensor 4 into account, as well as measurement data from the MEMS microphone 6. By comparison, in conventional sensor devices, only measurement data from pressure sensors and/or acceleration sensors can be used for detecting an impact event, whereas measurement data from a MEMS microphone (in particular audio data) can be disregarded. By additionally considering MEMS microphone measurement data according to the disclosure, the reliability of correct detection and therefore of correct air-bag activation can be increased compared to conventional sensor devices. The additional data provided by the MEMS microphone 6 can be used to extend and improve the database on the basis of which impact events are detected. In addition, due to the more comprehensive measurement data, decision times for activating an air-bag can be reduced.

Detection of an impact event by the logic unit 8 can be based on or comprise one or more actions performed by the logic unit 8. In an example, the detection can include correlating a measurement signal supplied by the MEMS microphone 6 with predefined reference signals. For each of the above-mentioned impact events, a reference signal may be predefined, which can contain characteristic properties of the respective impact event. For example, a reference signal can comprise one or more peak values (peaks) at one or more frequencies. The amplitudes of these peak values can each be in an associated predefined value range. Due to the different characteristics (e.g. position and/or amplitudes of the peaks), for example, a reference signal for a vehicle accident can differ clearly from a reference signal for slamming of a vehicle door. The given reference signals may be stored in a storage device (not shown), which may or may not be considered as part of the sensor device 100. If the correlation of a measurement signal with the predefined reference signals results in a (substantial) correspondence between the measurement signal and a specific reference signal, the logic unit 8 can identify the impact event accordingly.

In another example, the detection of an impact event by the logic unit 8 can comprise comparing a measurement signal supplied by the MEMS microphone 6 with a predefined threshold value. For example, an impact event can be identified as a vehicle accident if the amplitudes of detected sound waves exceed a specified threshold. It should be noted that detection of an impact event is not necessarily limited to the above actions. Other techniques can be alternatively or additionally used, such as the application of so-called "smart algorithms". Furthermore, the detection of an impact event need not be limited to the application of only one of the above actions, but may be based on any combination of the actions.

In the example of FIGS. 1A and 1B, the logic unit 8 is represented as a single component. In practice, the logic unit 8 can comprise one or more logic circuits that can be integrated in the same chip or in different chips. In particular, the logic unit 8 can comprise a first logic circuit, which can be assigned to the acceleration sensor 2 and/or the pressure sensor 4 and can be configured to process measurement data from these sensors. Furthermore, the logic unit 8 can have a second logic circuit, which can be assigned to the MEMS microphone 6 and can be configured to process measurement data from the MEMS microphone 6.

In the example of FIGS. 1A and 1B, the acceleration sensor 2, the pressure sensor 4, the MEMS microphone 6 and the logic unit 8 can be arranged in a common housing 10. The use of the common housing 10 can save space and/or costs. In addition, the components mentioned may be arranged together in a motor vehicle at the same location as a sensor device 100. In an example, the sensor device 100 can be configured to be located in a cavity of a vehicle door. For example, the pressure changes caused by an impact event inside the vehicle door can be detected by the pressure sensor 4 and the sound waves generated can be detected by the MEMS microphone 6.

In other examples, the components mentioned do not necessarily need to be arranged in the same housing. For example, the logic unit 8 may be arranged outside the housing 10, in which case it may or may not be considered part of the sensor device 100. For example, the logic unit 8 can be an air-bag control unit, to which the sensors 2, 4 and the MEMS microphone 6 can be assigned as satellite sensors. A satellite sensor can be a sensor that is relocated to a crash zone and can be used to detect a vehicle accident earlier than sensors in the control unit. Satellite sensors can take the form of acceleration and pressure sensors, which can detect, for example, a sudden decrease in the internal volume of a door in the event of a side imp act.

In particular, the MEMS microphone 6 does not necessarily need to be arranged in the same housing or at the same location as the other components of the vehicle. Preferably, microphones already present in the vehicle can be used to detect sound waves generated by an impact event and to generate measurement data based on the impact event, which can be provided to the logic unit 8. The use of existing vehicle components in this way can save effort and reduce costs. In one example, the MEMS microphone 6 can comprise a vehicle interior microphone, i.e. a microphone located inside the vehicle. Such a microphone can be, for example, a vehicle infotainment microphone, as can be included in a hands-free speech device. In a further example, the MEMS microphone 6 can comprise a vehicle exterior microphone, which can be configured to monitor the area surrounding the vehicle.

In the example of FIGS. 1A and 1B, the sensors 2, 4, the MEMS microphone 6 and the logic unit 8 are shown as mutually separate components. In other examples, one or more of these components can also be combined in the same circuit or in the same chip. Furthermore, a sensor device according to the disclosure can comprise only one of the two sensors 2, 4. In this case, a sensor device according to the disclosure may comprise, for example: a first semiconductor chip, with the sensor and a first logic circuit assigned to the sensor being integrated into the first semiconductor chip, a second semiconductor chip, with the MEMS microphone being integrated into the second semiconductor chip, and a third semiconductor chip, with a second logic circuit assigned to the MEMS microphone being integrated into the third semiconductor chip. Alternatively, a sensor device according to the disclosure may comprise: a first semiconductor chip, with the sensor being integrated into the first semiconductor chip, a second semiconductor chip, with a first logic circuit assigned to the sensor being integrated into the second semiconductor chip, a third second semiconductor chip, with the MEMS microphone being integrated into the third semiconductor chip, and a fourth semiconductor chip, with a second logic circuit assigned to the MEMS microphone being integrated into the fourth semiconductor chip.

Figure 2A:
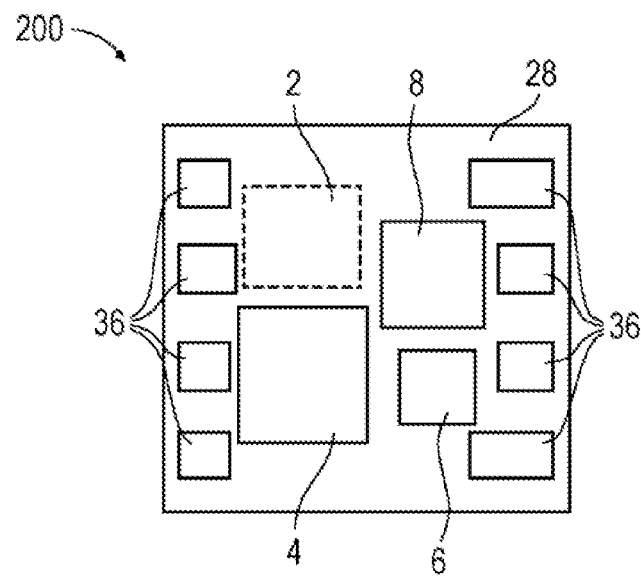
FIGS. 2A and 2B schematically illustrate a plan view and a cross-sectional side view, respectively, of a sensor device 200 according to the disclosure.
Figure 2B:
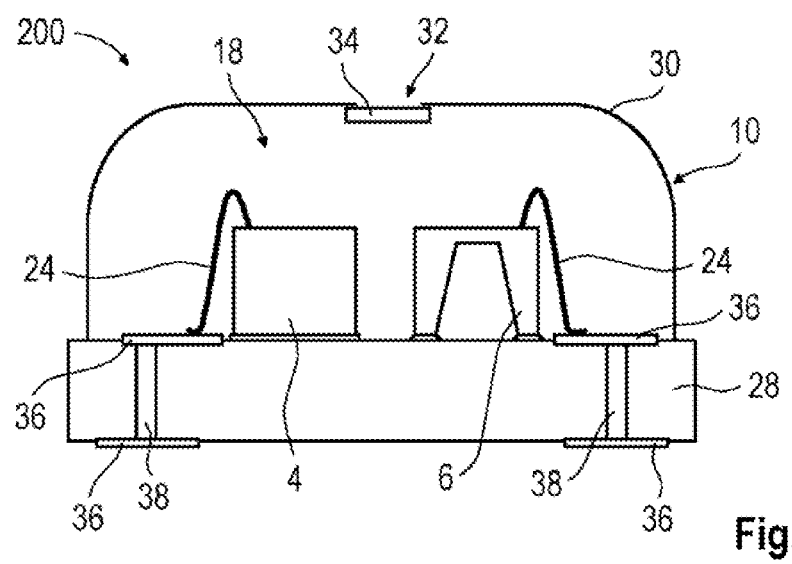

The sensor device 200 of FIGS. 2A and 2B can be at least partially similar to the sensor device 100 of FIGS. 1A and 1B and comprise the same functionalities described above. In contrast to FIGS. 1A and 1B, the sensors 2, 4, the MEMS microphone 6 and the logic unit 8 in FIGS. 2A and 2B can be arranged in a different type of housing. The housing 10 of FIGS. 2A and 2B can comprise a chip carrier 28 and a lid 30 with one or more sound openings 32. In an example, the chip carrier 28 can be a laminate, in particular a laminate in the form of an organic multilayer substrate similar to a printed circuit board. In another example, the chip carrier 28 can be a ceramic chip carrier. In a further example, the chip carrier can be a lead frame, which can be manufactured from a metal and/or a metal alloy. The chip carrier 28 and the lid 30 can form a cavity 18, wherein the sensors 2, 4, the MEMS microphone 6 and the logic unit 8 can be arranged on the chip carrier 28 and in the cavity 18. For example, the lid 30 can be manufactured from a metal or a metal alloy. Optionally, the sound opening 32 can be at least partially covered by a membrane 34. For example, the membrane 34 can be porous, so that a gas flow or gas exchange is provided between the cavity 18 and the area surrounding the sensor device 200. The membrane 34 can prevent dirt, various types of contamination, particles, etc. from entering the cavity 18. For example, the membrane 34 can be manufactured from a metallic and/or organic material.

In an example, the substrate 28 can be made of a printed circuit board material (e.g. FR4). Electrically conducting structures 36 can be provided on the upper and lower sides of the substrate 28, which can form contact pads for electrical contacting among other things. The sensors 2, 4, the MEMS microphone 6 and the logic unit 8 can be electrically connected to the conducting structures 36 on the top of the substrate 28 via electrical connection elements 24. The sensor device 200 can be electrically connected to another electrical component (e.g. a printed circuit board) via the electrical conducting structures 36 (e.g. in the form of so-called "landing pads") on the underside of the substrate 28. The substrate 28 can comprise one or more electrical vias 38 that can run from the substrate top to the substrate underside. The components of the sensor device 200 arranged within the cavity 18 can thus be electrically contacted via the contact pads arranged on the underside of the substrate 28.

Figure 3A:
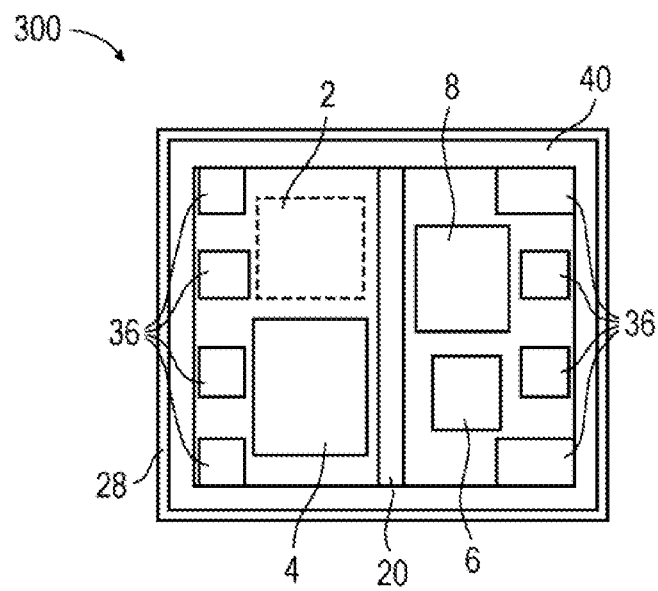
FIGS. 3A and 3B schematically illustrate a plan view and a cross-sectional side view, respectively, of a sensor device 300 according to one or more embodiments.
Figure 3B:
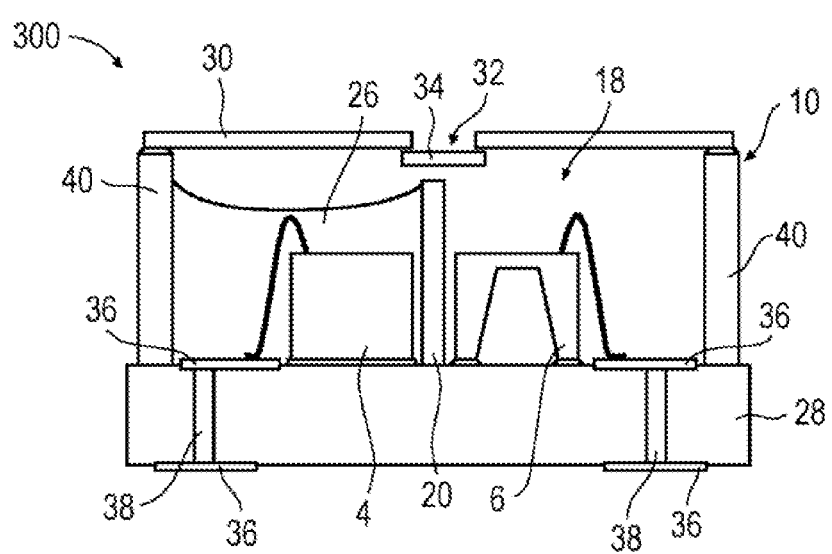

The sensor device 300 of FIGS. 3A and 3B can be at least partially similar to the sensor devices 100 and 200 of FIGS. 1A, 1B, 2A, and 2B and 2 and have the same functionalities. In contrast to FIGS. 1A, 1B, 2A, and 2B, the sensors 2, 4, the MEMS microphone 6 and the logic unit 8 of the sensor device 300 can be arranged in a different type of housing. The housing 10 of the sensor device 300 can comprise a chip carrier 28 and a lid 30 with one or more sound openings 32 and a polymer frame 40. The polymer frame 40 can be made of one or more of a thermosetting plastic, a thermoplastic or a liquid crystal polymer (LCP). The chip carrier 28, the lid 30 and the polymer frame 40 can form a cavity 18, wherein the sensors 2, 4, the MEMS microphone 6 and the logic unit 8 can be arranged on the chip carrier 28 and in the cavity 18. The chip carrier 28 can then form a base of the housing 10, the polymer frame 40 can form side walls of the housing and the lid 30 an upper part of the housing 10.

Figure 4A:
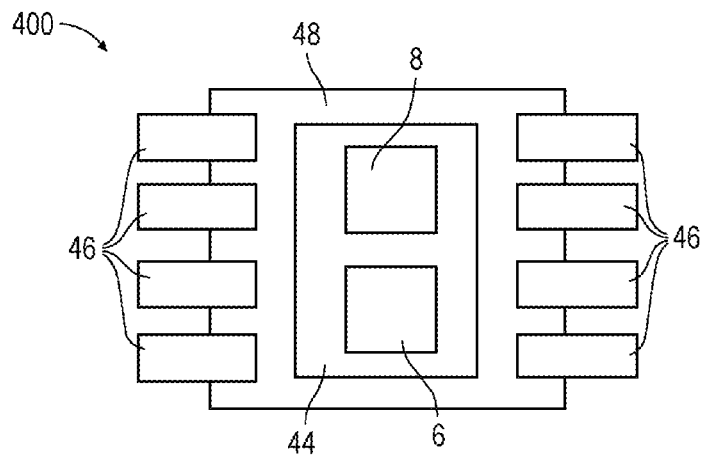
FIGS. 4A to 4C schematically illustrate a plan view, a view from below, and a cross-sectional side view, respectively, of a sensor device 400 according to one or more embodiments.
Figure 4B:
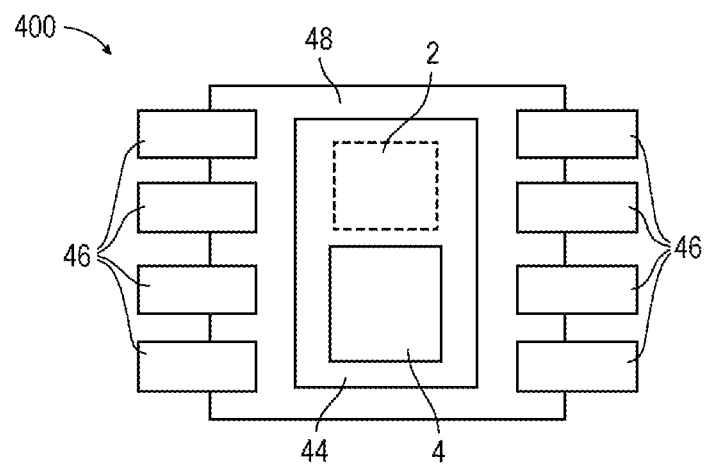
Figure 4C:
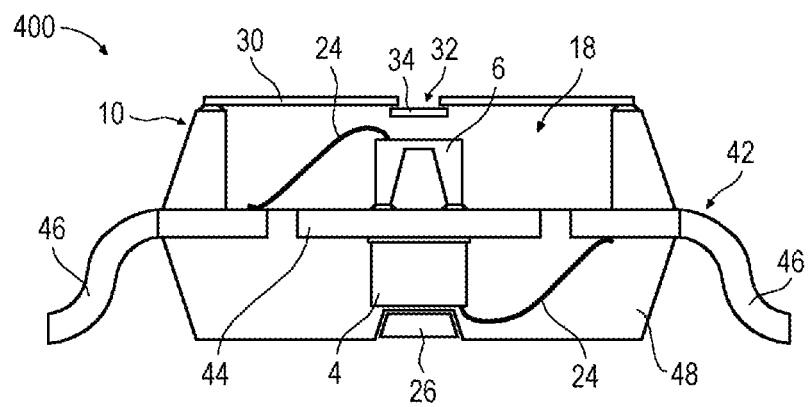

The sensor device 400 of FIGS. 4A-4C can be at least partially similar to the sensor devices of the previously described figures and have the same functionalities. However, the housing type may differ from the previous examples. FIGS. 4A-4C shows a plan view (see FIG. 4A), a view from below (see FIG. 4B) and a cross-sectional side view (see FIG. 4C) of the sensor device 400. The sensor device 400 can have a lead frame 42 with one or more mounting surfaces (e.g. in the form of diepads) 44 as well as one or more terminal conductors (leads or pins) 46. In the example of FIGS. 4A-4C, the acceleration sensor 2 and the pressure sensor 4 can be mounted on the underside of the diepad 44, while the MEMS microphone 6 and the logic unit 8 can be located on the opposite, upper side of the diepad 44.

The sensor device 400 can comprise an encapsulation material 48 into which one or both of the sensors 2, 4 can be embedded. The pressure sensor 4 can remain at least partially uncovered by the encapsulation material 48. The part of the pressure sensor 4 that is not covered by the encapsulation material 48 can optionally be covered by an elastic protective material 26, in which case pressure detection should still be ensured by means of sensitive structures of the pressure sensor 4. The sensor device 400 can also have a lid 30 with one or more sound openings 32, which can be optionally covered by a sound-permeable membrane 34. The lead frame 42, the encapsulation material 48 and the lid 30 can form a cavity 18 in which the MEMS microphone 6 can be arranged. For example, the lid 30 can be manufactured from a molding compound, a metal and/or a metal alloy. For example, the encapsulation material 48 can be produced from a molding compound.

Figure 5:
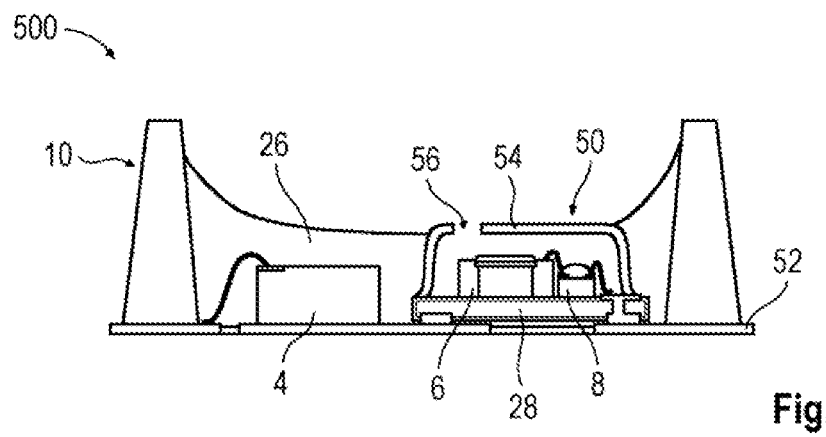
FIG. 5 shows a schematic, cross-sectional side view of a sensor device 500 according to one or more embodiments.

The sensor device 500 of FIG. 5 can be at least partially similar to the sensor devices of the preceding figures and have the same functionalities. The sensor device 500 can comprise a pressure sensor 4 and a component 50, which can be arranged on a carrier 52 and in a housing 10. The carrier 52 can be, for example, a laminate, a substrate or a lead frame. The pressure sensor 4 and the component 50 can be at least partially embedded in a protective material 26. The component 50 can comprise a MEMS microphone 6 and a logic unit 8 assigned to the MEMS microphone 6, which logic unit can be arranged on a substrate 28 in a smaller housing 54. The housing 54 can have a sound opening 56 which provides a gas connection between the environment and the interior of the housing 54. The component 50 can be a conventional microphone package, for example.

Figure 6:
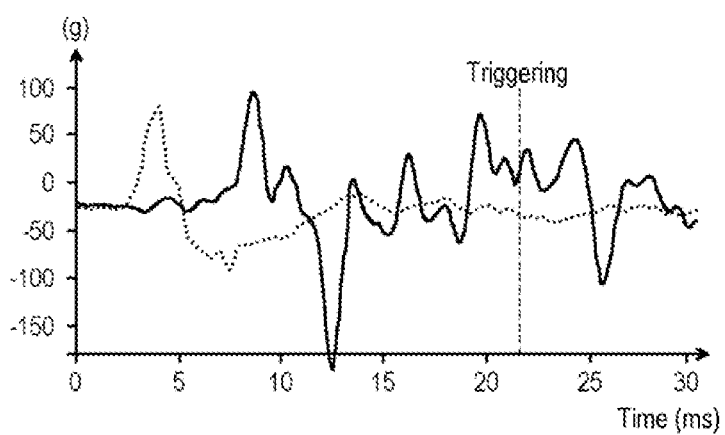
FIG. 6 shows accelerations detected by an acceleration sensor for different impact events.

FIG. 6 shows accelerations detected by an acceleration sensor for different impact events. In the figure, the detected accelerations (in g) are plotted against time (in ms). The solid curve shows accelerations detected during a vehicle accident. In the example of FIG. 6, the vehicle accident can be, in particular, a head-on impact. The impact of the vehicle at time zero results in deflections of the sensor membrane, so that positive and negative accelerations are detected. After approximately 21.5 ms, the impact event can be detected by the acceleration sensor, or a logic unit assigned to it, as a vehicle accident and a vehicle air-bag can be triggered. The example of FIG. 6 shows that detection of the vehicle accident need not necessarily be based on a specific acceleration threshold. Instead, to detect a vehicle accident, complex software algorithms can be used which can take into account, for example, the individual waveform of the recorded signal. The dotted curve shows accelerations detected during the impact of a football on a vehicle. In a similar way to the vehicle accident, positive and negative accelerations can be detected, albeit with smaller amplitudes. None of the vehicle air-bags is activated during this impact event.

Figure 7:
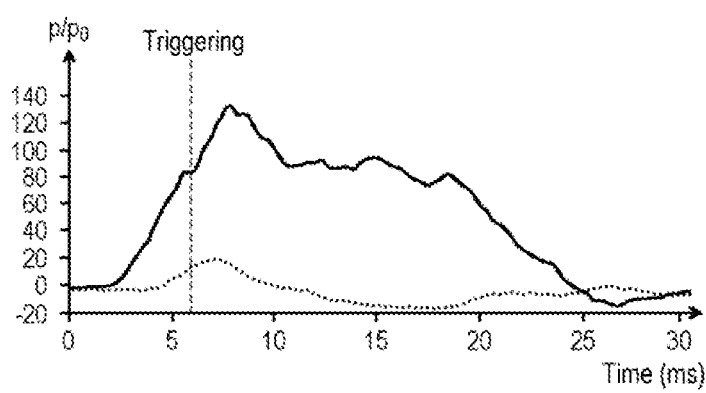
FIG. 7 shows pressures detected by a pressure sensor for different impact events.

FIG. 7 shows pressures detected by a pressure sensor for different impact events. The detected pressures p in this case are expressed in relation to a reference pressure $p_0$ (cf. $p/p_0$) and plotted against time (in ms). The continuous curve shows the pressures detected during a vehicle accident. In the example of FIG. 7, the vehicle accident can be, in particular, a side impact. The effect on the vehicle at time zero leads to an increase in the pressure, such as can be measured inside a vehicle door, for example. After approximately 6 ms, the impact event can be detected by the acceleration sensor, or a logic unit assigned to it, as a vehicle accident and a vehicle air-bag can be triggered. The example of FIG. 7 shows that a vehicle accident can be detected, for example, when a predefined pressure threshold value is exceeded. The dotted curve shows pressures detected during the impact of a football on a vehicle (e.g. an impact against a vehicle door). The pressures recorded here have smaller amplitudes, wherein no vehicle air-bag is activated.

Figure 8:
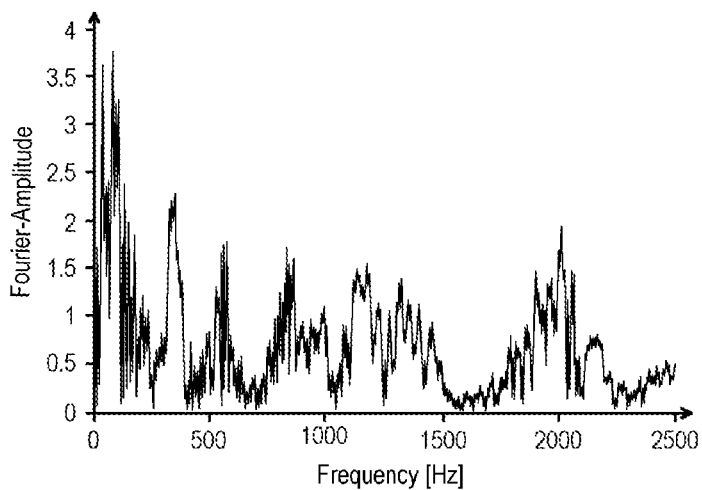
FIG. 8 shows measurement data detected by a microelectromechanical system (MEMS) microphone for an impact event.

FIG. 8 shows measurement data for an impact event recorded by a MEMS microphone and Fourier-transformed. The impact event shown can be, in particular, a vehicle accident. The MEMS microphone can capture sound waves generated by the impact event and generate measurement data to which a Fourier transform (or a fast Fourier transform) can be applied. FIG. 8 shows the Fourier amplitudes plotted against frequency (in Hz). FIG. 8 shows a signal waveform with a plurality of peaks at specific frequencies, wherein the peaks with the highest amplitudes can be located at comparatively low frequencies ranging from approximately 0 Hz to approximately 500 Hz. From the position and amplitudes of the peaks a signal waveform with characteristic information can be obtained, which is typical of a vehicle accident. The signal waveform can be analyzed by a logic unit and the impact event can be detected as a vehicle accident.

Figure 9:
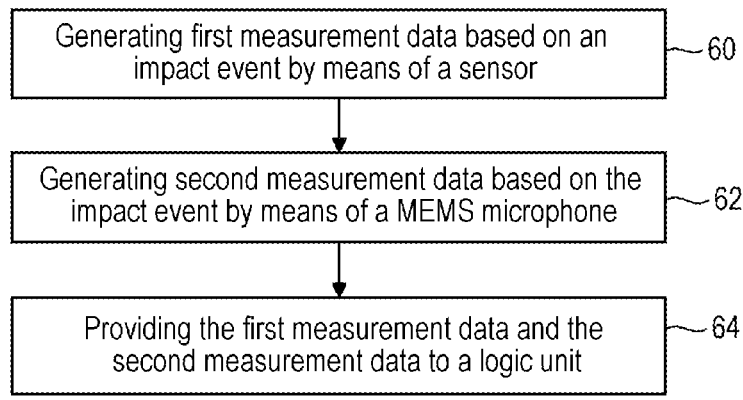
FIG. 9 shows a flow diagram of a method according to one or more embodiments.

The method of FIG. 9 is a method for detecting an impact event. The method is presented in a general manner, in order to describe aspects of the disclosure in qualitative terms. The method can have further aspects, which for the sake of simplicity are not shown or described in FIG. 9. For example, the method can be extended by one or more of the aspects that are described in conjunction with the preceding figures.

At 60, a physical quantity generated by an impact event is detected and first measurement data based on the impact event is generated by a sensor. At 62, sound waves generated by the impact event are detected and second measurement data based on the impact event are generated by a MEMS microphone. At 64, the first measurement data and the second measurement data are provided to a logic unit. The logic unit is configured to detect the impact event based on a combination of the first measurement data and the second measurement data. The method of FIG. 9 may comprise further optional actions. For example, in another action, an air-bag of a vehicle can be activated if the impact event is detected as a vehicle accident.

Figure 10:
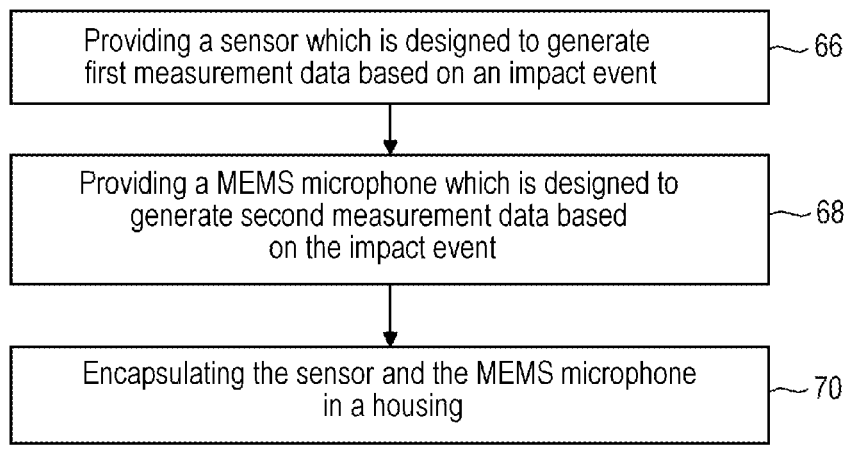
FIG. 10 shows a flow diagram of a method according to one or more embodiments.

The method of FIG. 10 is a method for producing a sensor device. The method of FIG. 10 is presented in a general form in order to describe aspects of the disclosure in qualitative terms. The method can have further aspects, which for the sake of simplicity are not shown or described in FIG. 10. For example, the method can be extended by one or more of the aspects that are described in conjunction with the preceding figures.

At 66, a sensor is provided that is configured to capture a physical quantity generated by an impact event and to generate first measurement data based on the impact event. At 68 a MEMS microphone is provided which is configured to detect sound waves generated by the impact event and to generate second measurement data based on the impact event. At 70, the sensor and the MEMS microphone are encapsulated in a housing, forming a sensor device. The sensor device is configured to provide the first measurement data and the second measurement data to a logic unit. The logic unit is configured to detect the impact event based on a combination of the first measurement data and the second measurement data.

EXAMPLES

In the following, devices and methods are explained on the basis of the following examples.

Example 1 is a sensor device comprising: a sensor which is configured to detect a physical quantity generated by an impact event and to generate first measurement data based on the impact event; and a MEMS microphone which is configured to detect sound waves generated by the impact event and to generate second measurement data based on the impact event, wherein the sensor device is configured to provide the first measurement data and the second measurement data to a logic unit, the logic unit being configured to detect the impact event based on a combination of the first measurement data and the second measurement data.

Example 2 is a sensor device according to example 1, further comprising: a housing, wherein the sensor and the MEMS microphone are arranged in the same housing.

Example 3 is a sensor device according to example 2, wherein the logic unit is arranged in the same housing.

Example 4 is a sensor device according to any of the preceding examples, the sensor comprising at least one of the following: a pressure sensor configured to detect pressures generated by the impact event, or an acceleration sensor configured to detect accelerations generated by the impact event.

Example 5 is a sensor device according to any of the preceding examples, wherein the MEMS microphone is configured to detect sound waves up to a frequency of 20 kHz, and the second measurement data used by the logic unit to detect the impact event is based on a frequency range of up to 20 kHz.

Example 6 is a sensor device according to any of the preceding examples, wherein the MEMS microphone is configured to detect ultrasonic waves and the second measurement data used by the logic unit to detect the impact event is based on an ultrasonic frequency range.

Example 7 is a sensor device according to any of the preceding examples, wherein the MEMS microphone comprises at least one of a vehicle infotainment microphone, a vehicle interior microphone, or a vehicle exterior microphone.

Example 8 is a sensor device according to any of the preceding examples, wherein the logic unit is configured to detect at least one of the following impact events: a vehicle accident, a slamming of a vehicle door, an impact of an object on a vehicle, a breakage of a vehicle window.

Example 9 is a sensor device according to any of the preceding examples, wherein the logic unit is configured to provide a signal for activating an air bag if the logic unit detects the impact event as a vehicle accident.

Example 10 is a sensor device according to any of the preceding examples, wherein detection of the impact event by the logic unit comprises at least one of the following: correlating a measurement signal based on the second measurement data with predefined reference signals, or comparing the measurement signal with a predefined threshold value.

Example 11 is a sensor device according to any of the preceding examples, wherein the sensor device is configured to be arranged in a cavity of a vehicle door.

Example 12 is a sensor device according to any of the preceding examples, further comprising: a first semiconductor chip, the sensor and a first logic circuit assigned to the sensor being integrated into the first semiconductor chip; a second semiconductor chip, the MEMS microphone being integrated into the second semiconductor chip; and a third semiconductor chip, a second logic circuit assigned to the MEMS microphone being integrated into the third semiconductor chip.

Example 13 is a sensor device according to any of the examples 1 to 11, further comprising: a first semiconductor chip, with the sensor being integrated into the first semiconductor chip; a second semiconductor chip, with a first logic circuit assigned to the sensor being integrated into the second semiconductor chip; a third second semiconductor chip, with the MEMS microphone being integrated into the third semiconductor chip; and a fourth semiconductor chip, with a second logic circuit assigned to the MEMS microphone being integrated into the fourth semiconductor chip.

Example 14 is a sensor device according to any of the examples 2 to 13, the housing comprising: a shell produced from a molding compound; and a lid with a sound opening, with the shell and the lid forming a cavity, wherein the sensor and the MEMS microphone are arranged on a base surface of the shell in the cavity.

Example 15 is a sensor device according to any of the examples 2 to 13, the housing comprising: a chip carrier; and a lid with a sound opening, with the chip carrier and the lid forming a cavity, wherein the sensor and the MEMS microphone are arranged on the chip carrier in the cavity.

Example 16 is a sensor device according to any of the examples 2 to 13, the housing comprising: a chip carrier; a lid with a sound opening; and a polymer frame, wherein the chip carrier, the lid and the polymer frame form a cavity, wherein the sensor and the MEMS microphone are arranged on the chip carrier in the cavity.

Example 17 is a sensor device according to any of the examples 2 to 13, the housing comprising: a lead frame, with the sensor and the MEMS microphone being mounted on opposite mounting surfaces of the lead frame; an encapsulation material, wherein the sensor is embedded in the encapsulation material; and a lid with a sound opening, wherein the lead frame, the encapsulation material and the lid form a cavity and the MEMS microphone is arranged in the cavity.

Example 18 is a method for detecting an impact event, the method comprising: detecting a physical quantity generated by an impact event and generating first measurement data based on the impact event by means of a sensor; detecting sound waves generated by the impact event and generating second measurement data based on the impact event by means of a MEMS microphone; and providing the first measurement data and the second measurement data to a logic unit, wherein the logic unit is configured to detect the impact event based on a combination of the first measurement data and the second measurement data.

Example 19 is a method according to example 18, further comprising: activating an air-bag if the impact event is detected as a vehicle accident.

Example 20 is a method for producing a sensor device, the method comprising: providing a sensor which is configured to detect a physical quantity generated by an impact event and to generate first measurement data based on the impact event; providing a MEMS microphone which is configured to detect sound waves generated by the impact event and to generate second measurement data based on the impact event; and encapsulating the sensor and the MEMS microphone in a housing, forming a sensor device, wherein the sensor device is configured to provide the first measurement data and the second measurement data to a logic unit, and the logic unit being configured to detect the impact event based on a combination of the first measurement data and the second measurement data.

Although specific embodiments have been illustrated and described herein, it is obvious to the person skilled in the art that a plurality of alternative and/or equivalent implementations can replace the specific embodiments shown and described, without departing from the scope of the present disclosure. This application is intended to include all modifications or variations of the specific embodiments discussed herein. It is therefore intended that this disclosure is limited only by the claims and their equivalents.

What is claimed is:

1. A sensor device, comprising:
    a sensor configured to detect a physical quantity generated by an impact event and to generate first measurement data based on the physical quantity generated by the impact event;
    a housing including a sound opening covered by a sound-permeable membrane, wherein the sound-permeable membrane is configured to enable a flow of a gas between a cavity formed by the housing and an area surrounding the sensor device; and
    a microelectromechanical system (MEMS) microphone arranged in the housing and configured to:
        detect sound waves generated by the impact event and communicated via the flow of the gas between the cavity and the area surrounding the sensor device,
        process the sound waves generated by the impact event based on a Fourier transform, and
        generate second measurement data based on the sound waves process based on Fourier transform,
    wherein the sensor device is configured to provide the first measurement data and the second measurement data to a processing circuit,
    wherein the processing circuit is configured to detect the impact event based on a combination of the first measurement data and the second measurement data.

2. The sensor device as claimed in claim 1, wherein the sensor and the MEMS microphone are arranged in the housing.

3. The sensor device as claimed in claim 2, wherein the sensor device comprises the processing circuit and the processing circuit is arranged in the housing.

4. The sensor device as claimed in claim 1, wherein the sensor includes:
    a pressure sensor configured to detect pressures generated by the impact event.

5. The sensor device as claimed in claim 1, wherein the MEMS microphone is configured to detect sound waves up to a frequency of 20 kHz, and wherein the second measurement data used by the processing circuit to detect the impact event is based on a frequency range of up to 20 kHz.

6. The sensor device as claimed in claim 1, wherein the MEMS microphone is configured to detect ultrasonic waves, and wherein the second measurement data used by the processing circuit to detect the impact event is based on an ultrasonic frequency range.

7. The sensor device as claimed in claim 1, wherein the MEMS microphone comprises at least one of a vehicle infotainment microphone or a vehicle interior microphone.

8. The sensor device as claimed in claim 1, wherein the processing circuit is configured to detect at least one of: a vehicle accident, a slamming of a vehicle door, an impact of an object on a vehicle, or a breakage of a vehicle window.

9. The sensing device as claimed in claim 1, wherein the processing circuit is configured to provide a signal for activating an air-bag in response to the processing circuit detecting the impact event as a vehicle accident.

10. The sensor device as claimed in claim 1, wherein detection of the impact event by the processing circuit comprises at least one of:
    correlating a measurement signal based on the second measurement data with predefined reference signals, or
    comparing the measurement signal with a predefined threshold.

11. The sensor device as claimed in claim 1, wherein the sensor device is configured to be arranged in a cavity of a vehicle door.

12. The sensor device as claimed in claim 1, wherein the processing circuit comprises a first logic circuit and a second logic circuit,
    wherein the first logic circuit is assigned to the sensor and is configured to receive the first measurement data from the sensor,
    wherein the second logic circuit is assigned to the MEMS microphone and is configured to receive the second measurement data from the MEMS microphone, and
    wherein the sensor device further comprises:
        a first semiconductor chip, wherein the sensor and the first logic circuit assigned to the sensor are integrated into the first semiconductor chip;
        a second semiconductor chip, wherein the MEMS microphone is integrated into the second semiconductor chip; and
        a third semiconductor chip, wherein the second logic circuit assigned to the MEMS microphone is integrated into the third semiconductor chip.

13. The sensor device as claimed in claim 1, wherein the processing circuit comprises a first logic circuit and a second logic circuit, wherein the first logic circuit is assigned to the sensor and is configured to receive the first measurement data from the sensor, wherein the second logic circuit is assigned to the MEMS microphone and is configured to receive the second measurement data from the MEMS microphone, and wherein the sensor device further comprises:
- a first semiconductor chip, wherein the sensor is integrated into the first semiconductor chip;
- a second semiconductor chip, wherein the first logic circuit assigned to the sensor is integrated into the second semiconductor chip;
- a third semiconductor chip, wherein the MEMS microphone is integrated into the third semiconductor chip; and
- a fourth semiconductor chip, wherein the second logic circuit assigned to the MEMS microphone is integrated into the fourth semiconductor chip.

14. The sensor device as claimed in claim 1, wherein the housing comprises:
- a shell manufactured from a molding compound; and
- a lid that includes the sound opening,
  - wherein the shell and the lid form the cavity, the sensor and the MEMS microphone being arranged on a base surface of the shell in the cavity.

15. The sensor device as claimed in claim 1, wherein the housing comprises:
- a chip carrier; and
- a lid that includes the sound opening,
  - wherein the chip carrier and the lid form the cavity, the sensor and the MEMS microphone being arranged on the chip carrier in the cavity.

16. The sensor device as claimed in claim 1, wherein the housing comprises:
- a chip carrier;
- a lid that includes the sound opening; and
- a polymer frame,
  - wherein the chip carrier, the lid and the polymer frame form the cavity, the sensor and the MEMS microphone being arranged on the chip carrier in the cavity.

17. The sensor device as claimed in claim 1, wherein the housing comprises:
- a lead frame, wherein the sensor and the MEMS microphone are mounted on opposite mounting surfaces of the lead frame;
- an encapsulation material, wherein the sensor is embedded in the encapsulation material; and
- a lid that includes the sound opening,
  - wherein the lead frame, the encapsulation material, and the lid form the cavity and the MEMS microphone is arranged in the cavity.

18. A method for detecting an impact event, the method comprising:
- detecting a physical quantity generated by the impact event;
- generating, by a sensor, first measurement data based on the physical quantity generated by the impact event;
- detecting sound waves generated by the impact event and communicated via a sound opening covered by a sound-permeable membrane, wherein the sound-permeable membrane is configured to enable a flow of a gas between a cavity formed by a housing and an area surrounding the sensor;
- processing the sound waves generated by the impact event based on a Fourier transform;
- generating, by a microelectromechanical system (MEMS) microphone, second measurement data based on the sound waves process based on Fourier transform; and
- detecting, by a processing circuit, the impact event based on a combination of the first measurement data and the second measurement data.

19. The method as claimed in claim 18, further comprising:
- activating an air-bag in response to the impact event being detected by the processing circuit as a vehicle accident.

20. A method for producing a sensor device, the method comprising:
- providing a sensor configured to detect a physical quantity generated by an impact event and to generate first measurement data based on the physical quantity generated by the impact event;
- providing a microelectromechanical system (MEMS) microphone configured to detect sound waves generated by the impact event, to process the sound waves generated by the impact event based on a Fourier transform, and to generate second measurement data based on the sound waves procced based on the Fourier transform; and
- encapsulating the sensor and the MEMS microphone in a housing, forming a sensor device,
  - wherein the housing includes a sound opening covered by a sound-permeable membrane,
  - wherein the sound-permeable membrane is configured to enable a flow of a gas between a cavity formed by the housing and an area surrounding the sensor device,
  - wherein the sound opening is configured to convey the sound waves generated by the impact event to the MEMS microphone via the flow of the gas between the cavity and the area surrounding the sensor device,
  - wherein the sensor device is configured to provide the first measurement data and the second measurement data to a processing circuit, and
  - wherein the processing circuit is configured to detect the impact event based on a combination of the first measurement data and the second measurement data.

* * * * *